(12) United States Patent
Balakrishnan et al.

(10) Patent No.: US 10,141,309 B2
(45) Date of Patent: Nov. 27, 2018

(54) TIGHT PITCH INVERTER USING VERTICAL TRANSISTORS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/825,088

(22) Filed: Nov. 28, 2017

(65) Prior Publication Data

US 2018/0233503 A1    Aug. 16, 2018

Related U.S. Application Data

(62) Division of application No. 15/434,125, filed on Feb. 16, 2017, now Pat. No. 9,876,015.

(51) Int. Cl.
*H01L 27/092*    (2006.01)
*H01L 29/66*    (2006.01)
(Continued)

(52) U.S. Cl.
CPC .... *H01L 27/092* (2013.01); *H01L 21/823431* (2013.01); *H01L 21/823487* (2013.01); *H01L 21/823814* (2013.01); *H01L 21/823821* (2013.01); *H01L 21/823864* (2013.01); *H01L 21/823871* (2013.01); *H01L 21/823885* (2013.01); *H01L 21/845* (2013.01); *H01L 23/528* (2013.01); *H01L 27/082* (2013.01); (Continued)

(58) Field of Classification Search
CPC ....... H01L 21/823885; H01L 27/11273; H01L 29/41741; H01L 29/66666; H01L 29/66712; H01L 29/7788; H01L 29/7827; H01L 29/7802; H01L 29/7926; H01L 21/823431; H01L 21/823487; H01L 21/823821; H01L 21/845; H01L 27/092; H01L 29/41791; H01L 29/66795; H01L 29/783; H01L 29/785
See application file for complete search history.

(56) References Cited

U.S. PATENT DOCUMENTS 5,414,288 A    5/1995  Fitch et al.
5,612,563 A    3/1997  Fitch et al.
(Continued)

FOREIGN PATENT DOCUMENTS

JP    5114968 B2    10/2012
KR    100920047 B1    9/2009

OTHER PUBLICATIONS

Computer translation of JP2008205168 (A), Sep. 4, 2008.

*Primary Examiner* — Thanhha Pham
(74) *Attorney, Agent, or Firm* — L. Jeffrey Kelly, Esq.; Hoffmann & Baron, LLP

(57) ABSTRACT

CMOS inverters including gate-all-around vertical transistors are fabricated without requiring center gate contacts, thereby allowing close positioning of the transistors. The gate contact and the drain contact of the transistors are shared. Wiring of inverter input, output and power supply lines is simplified.

11 Claims, 14 Drawing Sheets

(51) Int. Cl.
*H01L 29/78* (2006.01)
*H01L 21/82* (2006.01)
*H01L 23/528* (2006.01)
*H01L 21/8238* (2006.01)
*H01L 29/06* (2006.01)
*H01L 27/082* (2006.01)
*H01L 29/417* (2006.01)
*H01L 21/8234* (2006.01)
*H01L 21/84* (2006.01)
*H01L 29/778* (2006.01)
*H01L 27/112* (2006.01)

(52) U.S. Cl.
CPC .... *H01L 27/0924* (2013.01); *H01L 27/11273* (2013.01); *H01L 29/0649* (2013.01); *H01L 29/41741* (2013.01); *H01L 29/41791* (2013.01); *H01L 29/66545* (2013.01); *H01L 29/66666* (2013.01); *H01L 29/66712* (2013.01); *H01L 29/66795* (2013.01); *H01L 29/7788* (2013.01); *H01L 29/7802* (2013.01); *H01L 29/783* (2013.01); *H01L 29/785* (2013.01); *H01L 29/7827* (2013.01); *H01L 29/7853* (2013.01)

(56) References Cited

U.S. PATENT DOCUMENTS

| | | | |
|---|---|---|---|
| 6,304,483 | B1 | 10/2001 | Noble |
| 6,449,186 | B2 | 9/2002 | Noble |
| 6,461,900 | B1 | 10/2002 | Sundaresan et al. |
| 6,477,080 | B2 | 11/2002 | Noble |
| 6,747,314 | B2 | 6/2004 | Sundaresan et al. |
| 8,039,893 | B2 | 10/2011 | Masuoka et al. |
| 9,525,064 | B1 | 12/2016 | Balakrishnan et al. |
| 9,590,631 | B2 | 3/2017 | Masuoka et al. |
| 9,806,173 | B2 * | 10/2017 | Balakrishnan .... H01L 29/66666 |
| 2011/0275209 | A1 | 10/2011 | Breitwisch et al. |
| 2013/0093000 | A1 | 4/2013 | Guo et al. |
| 2016/0329348 | A1 | 11/2016 | Masuoka et al. |
| 2016/0344389 | A1 | 11/2016 | Masuoka et al. |

* cited by examiner

TIGHT PITCH INVERTER USING VERTICAL TRANSISTORS

CROSS-REFERENCE TO RELATED APPLICATIONS

This patent application is a divisional of U.S. patent application Ser. No. 15/434,125 filed Feb. 16, 2017, entitled "TIGHT PITCH INVERTER USING VERTICAL TRANSISTORS," the complete disclosure of which is expressly incorporated herein by reference in its entirety for all purposes.

BACKGROUND

The present disclosure relates generally to the electrical, electronic and computer arts and, more particularly, to inverters including vertical field-effect transistors (VFETs) and their fabrication.

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits.

CMOS inverter circuits including two MOSFETs, one being a pMOS FET, the other being an nMOS FET, have been developed. In such inverter circuits, both gates are electrically connected to an input line. The source of the NFET is tied to Vss (the low voltage power supply, for example ground). The source of the PFET is connected to Vdd (the high voltage power supply). $V_{out}$ is electrically connected to the drain terminals. The inverter input controls both transistors simultaneously.

Vertical field-effect transistors (VFETs) have configurations wherein the current between the drain and source regions is substantially normal to the surface of the die. A vertical field-effect transistor may include semiconductor pillar having top and base regions comprising source/drain regions, the portion of the pillar between the source/drain regions defining a channel region.

BRIEF SUMMARY

Techniques are provided for forming CMOS inverter circuits using VFET devices.

In one aspect, an exemplary fabrication method for forming an inverter includes obtaining a monolithic structure including a p-type region and an n-type region, the p-type region being electrically isolated from the n-type region. A dummy gate is formed on the monolithic structure. First and second semiconductor fins are epitaxially formed on the monolithic structure and within the dummy gate, the first semiconductor fin being formed on the p-type region and the second semiconductor fin being formed on the n-type region. A first drain region having p-type conductivity is formed on the first semiconductor fin and above the dummy gate and a second drain region having n-type conductivity is formed on the second semiconductor fin and above the dummy gate. The dummy gate is replaced with a gate dielectric layer and an electrically conductive gate electrode on the gate dielectric layer such that the gate dielectric layer adjoins the first and second semiconductor fins and the gate electrode adjoins the gate dielectric layer. The fabrication method results in the production of a vertical, p-type field-effect transistor comprising the p-type region, the first semiconductor fin, the first drain region, and the gate electrode and a vertical, n-type field-effect transistor comprising the n-type region, the second semiconductor fin, the second drain region, and the gate electrode. The gate electrode is shared by the p-type field-effect transistor and the n-type field-effect transistor.

In another aspect, an exemplary monolithic inverter structure includes a semiconductor structure including a p-type source region and an n-type source region, the p-type source region being electrically isolated from the n-type source region. A first semiconductor fin on the semiconductor structure directly contacts the p-type source region and a second semiconductor fin on the semiconductor structure directly contacts the n-type source region. A first drain region having p-type conductivity is on the first semiconductor fin and a second drain region having n-type conductivity is on the second semiconductor fin. A gate dielectric layer adjoins the first and second semiconductor fins and a gate electrode adjoins the gate dielectric layer. The p-type source region, the first semiconductor fin, the first drain region, and the gate electrode are configured as a vertical, p-type field-effect transistor. The n-type source region, the second semiconductor fin, the second drain region, and the gate electrode are configured as a vertical, n-type field-effect transistor. The gate electrode is shared by the p-type field-effect transistor and the n-type field-effect transistor and the first drain region is electrically connected to the second drain region.

Techniques as disclosed herein can provide substantial beneficial technical effects. By way of example only and without limitation, one or more embodiments may provide one or more of the following advantages:

Tight pitch;
Simple wiring of input, output and power supply lines;
Shared gate electrodes enabling close device placement;
Low inverter power dissipation;
Compatible with CMOS processing.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity and are not necessarily to scale. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A CMOS inverter device is disclosed that includes adjacent n-type and p-type VFETs that share a gate electrode and one or more gate contacts. The positioning of the n-type and p-type VFETs allows for simple wiring of input, output, and power supply lines. Inverters including adjacent vertical transistors as disclosed herein allow superior density scaling and relaxed gate lengths. FIGS. 1-21 illustrate a sequence of processing steps that may be employed to obtain a CMOS inverter device having such features.

Figure 1:
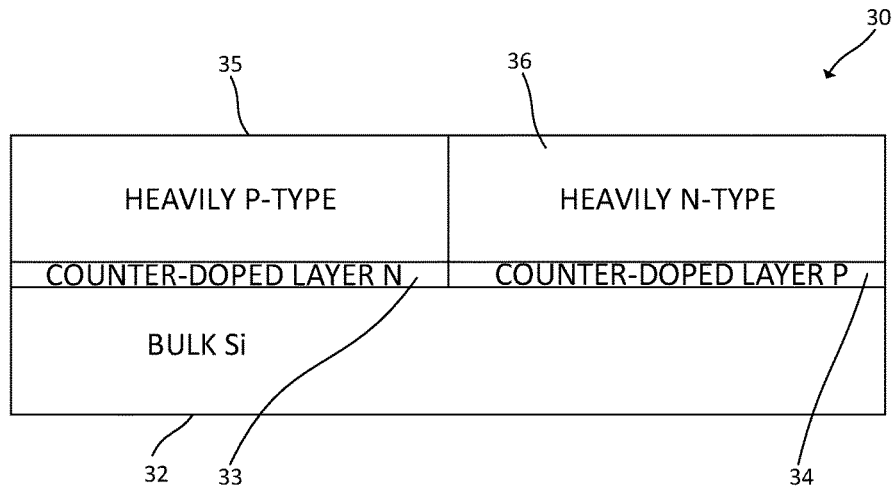
FIG. 1 is a schematic, cross-sectional view of a semiconductor structure including heavily doped p-type and n-type regions and counter-doped regions beneath the heavily doped regions.

FIG. 1 schematically depicts an exemplary monolithic semiconductor structure 30 formed using a bulk semiconductor substrate. Suitable substrate materials include but are not limited to silicon, silicon carbide, silicon germanium, and III-V materials. The structure 30 may, for example, include an essentially undoped bulk silicon layer 32 that can function as a handle, heavily doped p-type and n-type regions 35, 36 forming the top layers of the structure 30, and counter-doped n-type and p-type regions 33, 34 between the silicon layer 32 and the heavily doped top layers 35, 36. The doping levels of the heavily doped layers 35, 36 may be in the range of $2 \times 10^{20}$-$1 \times 10^{21}$ atoms/cm$^{-3}$. The heavily doped regions 35, 36 and the counter-doped regions 33, 34 are in adjoining relation, respectively forming pn and np junctions. The doping levels of the counter doped layers 33, 34 may be in the range of $1 \times 10^{18}$-$5 \times 10^{19}$ atoms/cm$^{-3}$. The counter-doped regions and heavily doped regions can be formed epitaxially on the silicon substrate layer 32. Ion implantation of the substrate layer 32 may alternatively be employed to form one or more of the doped regions. In-situ doping of the regions 33-36 can be conducted using conventional precursor materials and techniques. N-doped regions 36, 33 consisting essentially of phosphorus-doped silicon are employed in an exemplary embodiment. The p-doped regions 35, 34 may consist essentially of boron-doped silicon in one or more exemplary embodiments. In one exemplary embodiment, boron in the heavily doped p-type region 35 has a concentration in the range of $2$-$9 \times 10^{20}$ cm$^{-3}$ and is functional as a channel seed layer of the later-formed p-type VFET structure. Exemplary epitaxial growth processes that are suitable for use in epitaxially forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorus. In-situ n-doped silicon may be used to epitaxially form the heavily doped n-type region 36 while the portion of the structure including (or to include) the p-type region 35 is blocked by a mask. In-situ doping of the heavily doped regions 35, 36 can be conducted using conventional precursor materials and techniques, for example silane with diborane or phosphine/arsine. The in situ doped material can alternatively be a silicon germanium alloy, for example $Si_{1-x}Ge_x$ wherein x is between 0.1 and 0.3. The temperature for epitaxial deposition processes of silicon-based materials typically ranges from 450° C. to 900° C. The heavily doped regions 35, 36 have thicknesses between fifty and two hundred fifty nanometers (50-250 nm) and the counter-doped regions are five to fifty nanometers (5-50 nm) in thickness in some exemplary embodiments.

Figure 2:
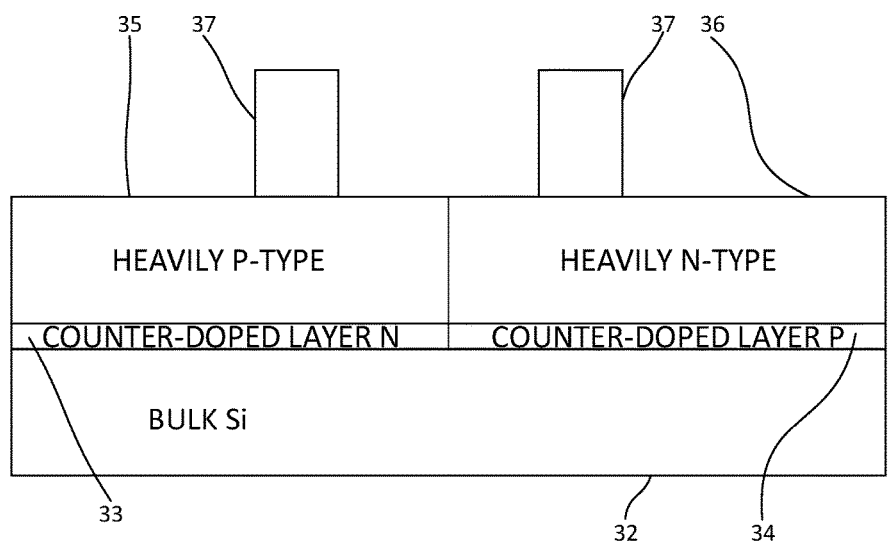
FIG. 2 is a schematic, cross-sectional view thereof following formation of dummy fins on the p-type and n-type regions.

Referring to FIG. 2, dummy fins 37 are formed on the heavily doped p-type and n-type regions 35, 36. A silicon nitride ($Si_3N_4$) layer can be conformally deposited via CVD, PECVD, sputtering, or other suitable technique on the top surface of the structure 30. Parallel dummy fins can be formed by removing unwanted material from the conformal layer using an anisotropic etching process such as reactive ion etching or plasma etching. The dummy fins, which comprise an STI formation block mask, have heights between, for example, 50-200 nm and widths between ten and twenty-five nanometers (10-25 nm). The fin 37 on the p-type region 35 and the fin 37 on the adjoining n-type region 36 are separated by a distance of between twenty and one hundred nanometers (20-100 nm). The distance between dummy fins 37 determines the width of the subsequently formed STI region that divides the pFET and nFET regions of the structure.

Figure 3:
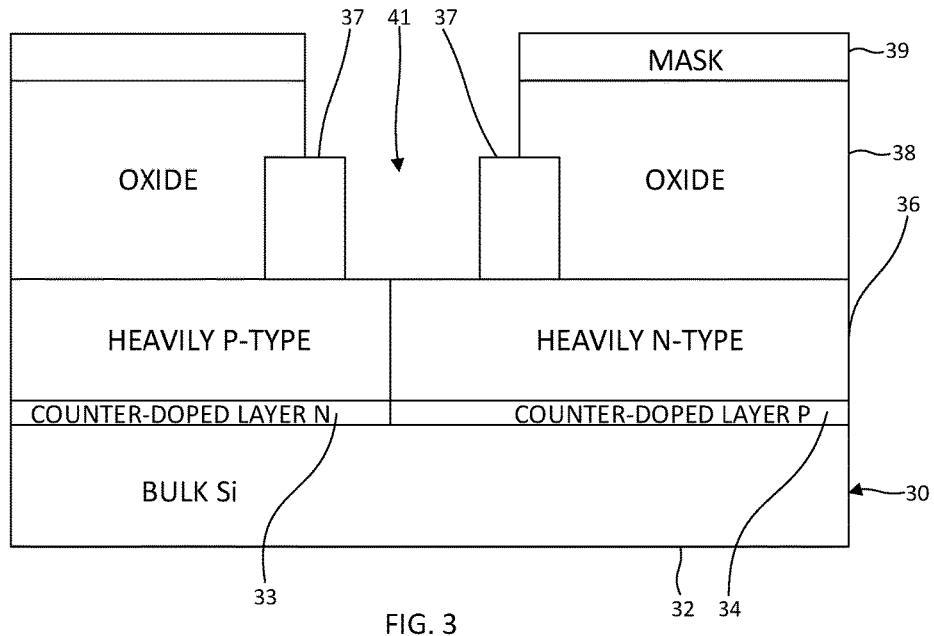
FIG. 3 is a schematic, cross-sectional view thereof following formation of a patterned cut mask.
Figure 4A:
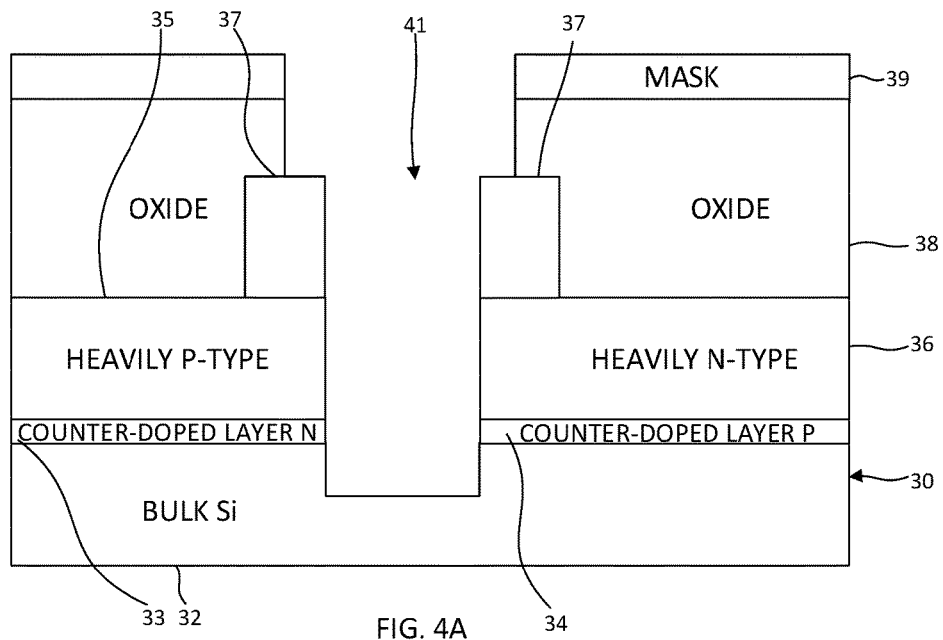
FIG. 4A is a schematic, cross-sectional view thereof following formation of a trench within the semiconductor structure.
Figure 4B:
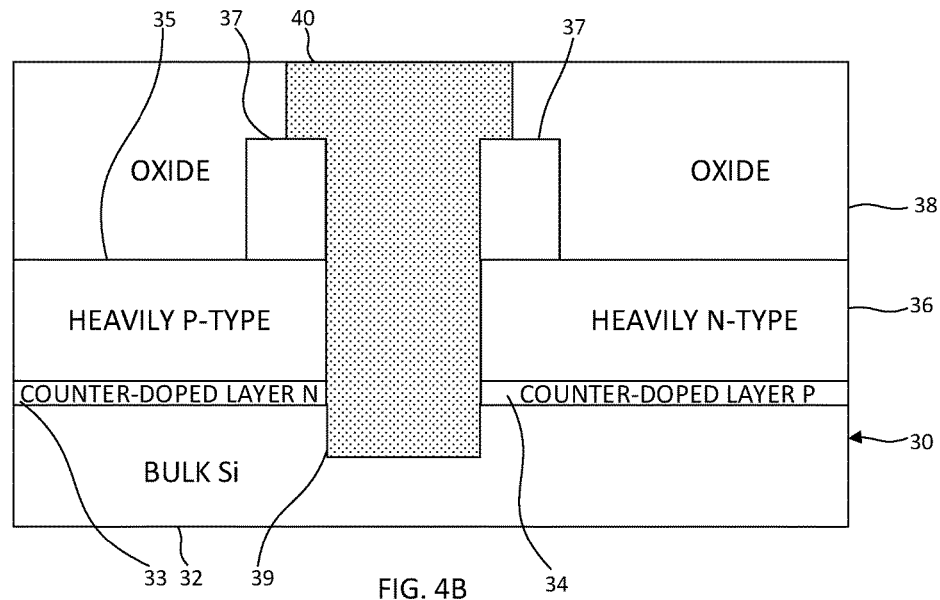
FIG. 4B is a schematic, cross-sectional view thereof following STI oxide deposition, mask removal and chemical mechanical planarization.

An oxide or other type of dielectric layer 38 is formed on the structure, covering the portions of the heavily doped regions 35, 36 and the dummy fins 37. A mask 39 is deposited on the oxide layer 38 and patterned to facilitate removal of oxide material above the inner portions of the dummy fins 37 and between the fins. The oxide layer 38 is recessed selective to both nitride as used to form the dummy fins and the semiconductor material forming the heavily doped regions. The selective etch causes the formation of a recess 41 between opposing surfaces of the dummy fins 37 and extending down to the heavily doped semiconductor regions 35, 36, as schematically illustrated in FIG. 3. The recess further includes a relatively wide upper portion between opposing surfaces of the dielectric layer 38 and above the inner portions of the top surfaces of the dummy fins 37. Anisotropic etching (RIE) of the resulting structure causes the recess 41 to be extended within the structure 30 and partially into the semiconductor substrate layer 32, forming a trench therein while leaving the nitride dummy fins 37 and the oxide layer 38 substantially intact. FIG. 4A shows the resulting structure. An oxide layer, for example silicon dioxide is deposited on the structure shown in FIG. 4A and fills or overfills the recess 41. The structure schematically illustrated in FIG. 4B is obtained following mask removal and chemical mechanical planarization. The portion of the oxide layer 40 extending within the structure 30 later functions as a shallow trench isolation (STI) region, as discussed further below. The use of a cut-mask as described above in the creation of the STI region enables tight pitch of the subsequently formed, adjacent vertical field-effect transistors.

Figure 5:
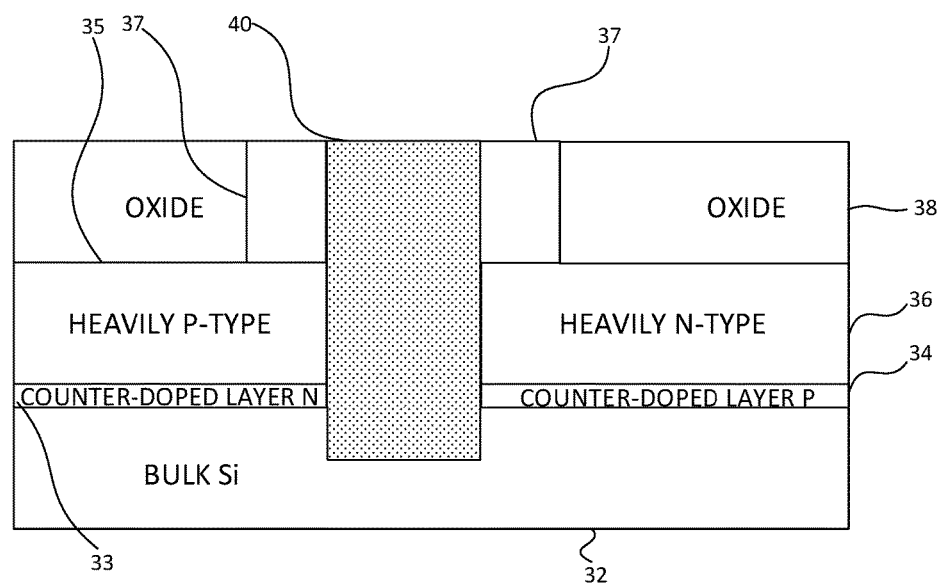
FIG. 5 is a schematic, cross-sectional view thereof following mask removal.
Figure 6:
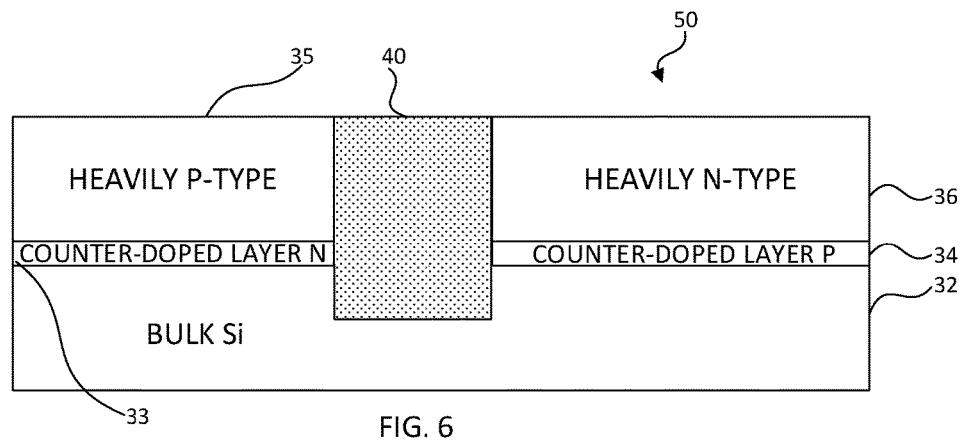
FIG. 6 is a schematic, cross-sectional view thereof following dummy fin removal.

Chemical mechanical planarization is continued to remove the oxide material down to the top surfaces of the nitride dummy fins 37, as shown in FIG. 5. The remaining oxide and nitride materials above the structure can be completely and simultaneously removed by further CMP, stopping on the top surfaces of the heavily doped semiconductor layers 35, 36, to obtain a structure 50 as shown in FIG. 6. The remaining portion of the oxide layer 40 forms a shallow trench isolation (STI) region that electrically isolates the pFET region of the structure 50 from the nFET region thereof. As indicated above, the width of the STI region is substantially the same as the distance between the parallel dummy fins 37. It will be appreciated that CMP processes using different chemicals can be employed for the sequential removal of the top portion of the oxide layer 38 and then the remaining portion of the oxide layer 38 and the nitride dummy fins 37.

Figure 7:
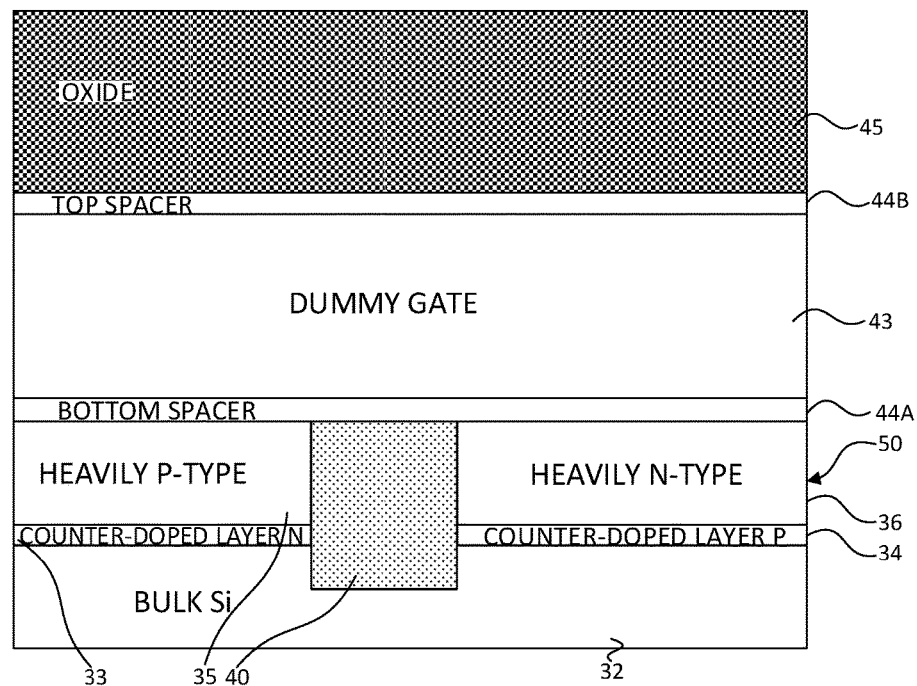
FIG. 7 is a schematic, cross-sectional view thereof following deposition of a dummy gate, spacers, and an oxide layer.

A bottom spacer 44A, a dummy gate 43, a top spacer 44B and a dielectric layer such as an oxide layer 45 are deposited sequentially on the structure 50, as shown in FIG. 7. Chemical vapor deposition and physical vapor deposition are exemplary methods for depositing these layers. In an exemplary embodiment, the bottom and top spacers 44A, 44B are silicon nitride, SiOCN or SiBCN spacers having thicknesses between three and fifteen nanometers (3-15 nm), the dummy gate 43 is amorphous silicon or polysilicon having a thickness between eight and one hundred nanometers (8-100 nm), and the oxide layer 45 is silicon dioxide, tetraethylorthosilicate (TEOS) oxide, high aspect ratio plasma (HARP) oxide, high temperature oxide (HTO), high density plasma (HDP) oxide. The oxide layer 45 has a thickness between thirty and two hundred nanometers (30-200 nm) in exemplary embodiments. A silicon nitride ($Si_3N_4$) layer can be deposited via CVD, PECVD, sputtering, or other suitable technique. Oxide layers such as silicon oxides can be formed using atomic layer deposition (ALD). Sacrificial gate material used to form the dummy gate 43 may be formed using physical vapor deposition (PVD), chemical vapor deposition (CVD), plasma enhanced chemical vapor deposition (PECVD), inductively coupled plasma chemical vapor deposition (ICP CVD), or any combination thereof.

Recesses 46 having substantially vertical sidewalls are formed through the deposited layers 45, 44B, 43, 44A down to the heavily doped p-type and n-type regions 35, 36 of the structure 50. As known in the art, such vertically extending recesses 46 can be formed using photolithographic techniques and one or more anisotropic etch processes. First portions of the recesses 46 can be formed through the oxide layer 45 by a reactive ion etch process selective to the top spacer material. A second etching process causes removal of portions of the top spacer 44B. A third etching process is then performed to extend the recesses through the dummy gate 43. At this point, the recesses 46 extend through the oxide layer 45, the top spacer 44B and the dummy gate 43, terminating at the top surface of the bottom spacer 44A. The width of each recess may be about three to about twenty nanometers (3-20 nm) and in some embodiments preferably between five and ten nanometers (5-10 nm). The depth of each recess may be about fifty to three hundred nanometers (50-300 nm), and in some embodiments preferably between one hundred to two hundred nanometers (100-200 nm). A further reactive ion etch process is employed using, for example, a $CHF_3$-based plasma, to extend the recesses 46 through the bottom spacer 44A. The etch process is selective to the semiconductor material forming the heavily doped p-type and n-type regions 35, 36. Surfaces of the heavily doped regions 35, 36 are accordingly exposed once the recesses have been extended through the bottom spacer 44A.

A thin layer of oxide 45A is formed along the sidewalls of the recesses within the dummy gate 43. The oxidation may be performed by a plasma oxidation process or other oxidation process that forms a thin oxide layer. Portions of the bottom spacer 44A or the heavily doped regions 35, 36 also may be oxidized. Any oxide formed on the heavily doped semiconductor regions 35, 36 is removed before subsequently performing epitaxial growth of semiconductor fins within the recesses 46, as described below.

Figure 8:
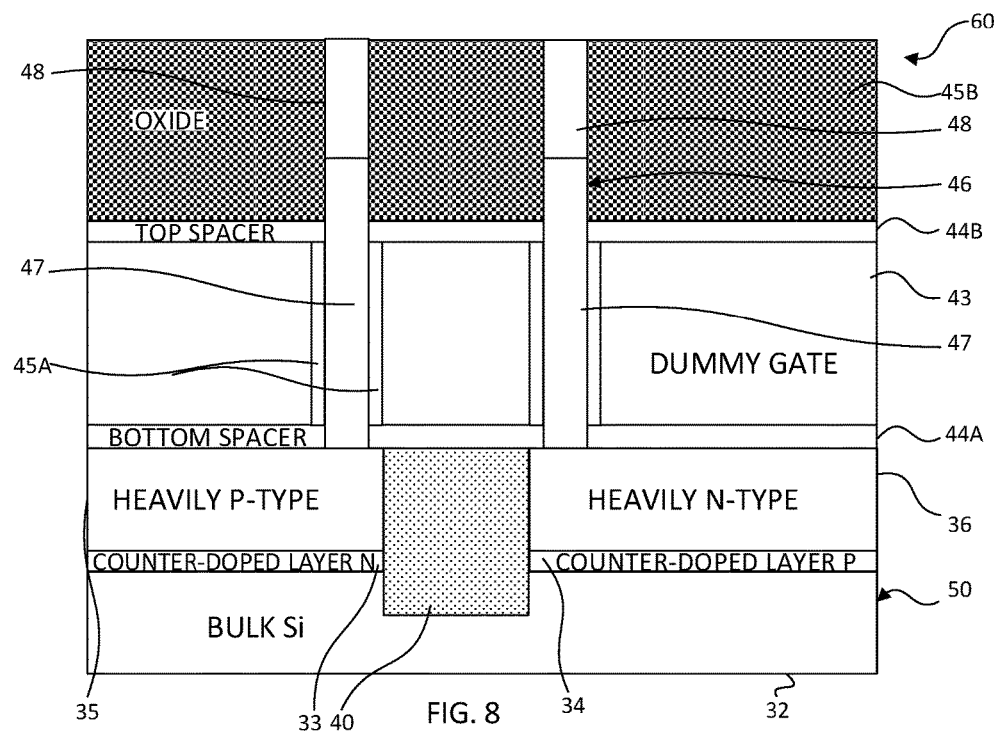
FIG. 8 is a schematic, cross-sectional view thereof following recess formation, semiconductor fin epitaxy, fin cap deposition, and chemical mechanical planarization.

Parallel semiconductor fins 47 are epitaxially formed within the recesses 46 and directly on the heavily doped p-type and n-type regions 35, 36. As discussed above, epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The growth of the fins is selective to formation on the exposed surfaces of the heavily doped regions 35, 36 and may extend above the top surface of the oxide layer 45. Such overburden can be removed by CMP. The sources for the epitaxial channel material used to form the fins 47 may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. Doped source extensions (not shown) can be epitaxially formed within the portions of the recesses within the bottom spacer 44A followed by the deposition of essentially undoped channel material. The top portions of the fins 47 are recessed within the oxide layer 45 to allow the deposition of silicon nitride or other suitable dielectric cap material within the top portions of the recesses and bounded by the oxide layer 45. RIE or wet etching may be employed to form the recesses above the fins 47 and within the oxide layer 45. The dielectric material for forming the caps 48 may be a dielectric oxide (e.g., silicon oxide), a dielectric nitride (e.g., silicon nitride), a dielectric oxynitride, or any combination thereof. The dielectric material is deposited by a deposition process, for example, chemical vapor deposition (CVD) or physical vapor deposition (PVD). A structure 60 including dielectric caps 48 on the top surfaces of the semiconductor fins 47, as shown in FIG. 8, may be obtained following CMP. The semiconductor fins 47, being positioned on opposite sides of the STI region 40, are electrically isolated. The formation of the STI region as discussed above allows the fins 47 to be formed close to each other. In some embodiments, the semiconductor fins 47 are separated by a distance of twenty to one hundred nanometers (20-100 nm).

Figure 9:
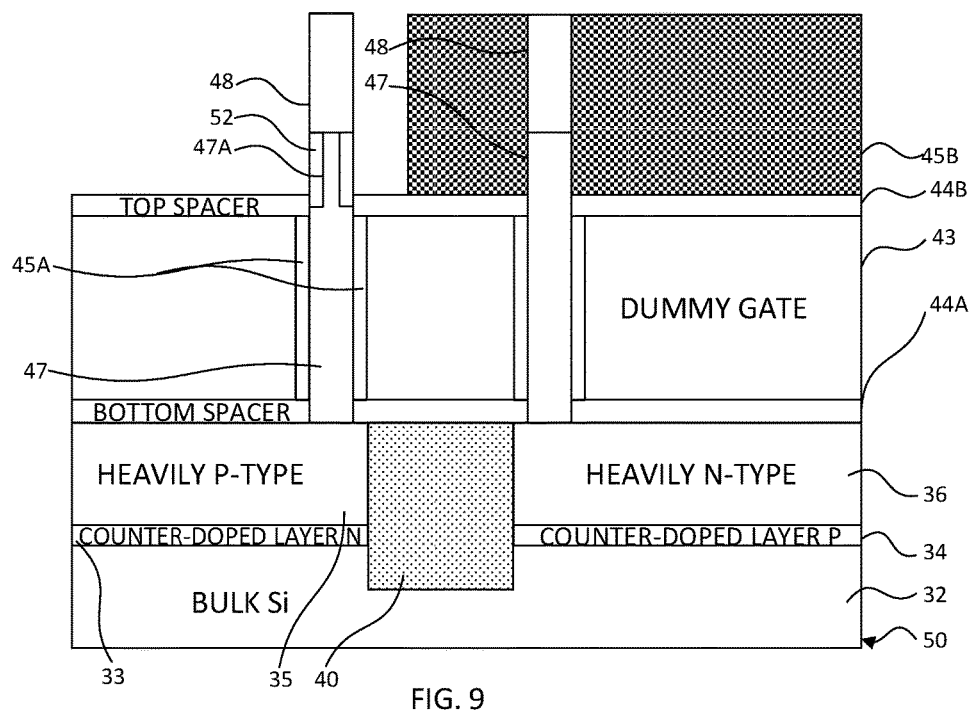
FIG. 9 is a schematic, cross-sectional view thereof following formation of recesses in a semiconductor fin in a pFET region of the structure and drain epitaxy.

The oxide layer 45 of the structure 60 can be selectively etched with respect to the adjoining silicon nitride elements 44B, 48 and the semiconductor fins 47. As shown in FIG. 9, the portion of the oxide layer 45 covering the top horizontal spacer 44B and the fin portion extending above the top horizontal spacer in the pFET region is removed. The top portion of the semiconductor fin 47 in the pFET region is then optionally subjected to a selective lateral etch to reduce the width thereof. An HCl gas etch may, for example, be employed. A relatively thin top fin portion 47A having vertical side walls is accordingly provided between the top spacer 44B and the bottom of the fin cap 48 and is integral with the remainder of the fin. In an exemplary embodiment, the portion of the fin 47 extending between the heavily doped p-type region 35 and the top horizontal spacer has a width between six and twelve nanometers (6-12 nm) while the top fin portion 47A has a width between two and four nanometers (2-4 nm). The distance between horizontal spacers 44A, 44B, which corresponds to the height of the channel portions of the subsequently formed pFET and nFET devices, can be between 10-30 nm in some embodiments, it being appreciated that channel dimensions can be tailored to obtain desired performance specifications. A p-doped epitaxial layer is grown on the exposed fin portion 47A, forming a first drain region 52 having p-type conductivity in the pFET region of the structure 50. The doping levels of the drain region 52 and the heavily doped p-type region 35 are substantially the same in some embodiments and have the same chemical compositions. In some embodiments, both the in situ doped drain region 52 and the heavily doped p-type region 35 consist essentially of boron-doped silicon. The drain region 52 at least initially forms a faceted, diamond-shaped structure including facets along (111) planes (not shown) inherent to epitaxial growth on the exposed (110) sidewall surfaces of the fin portion 47A. Using the cap 48 as a hard mask, the drain regions may optionally be subjected to RIE to remove the faceted portions of the drain region 52 such that the drain region is substantially coplanar with the vertical outer surfaces of the cap 48 and the underlying channel region of the fin 47. The resulting drain region 52 would accordingly occupy less space than the originally formed doped, epitaxial structure. The inclusion of faceted drain regions is preferred in some embodiments.

Figure 10:
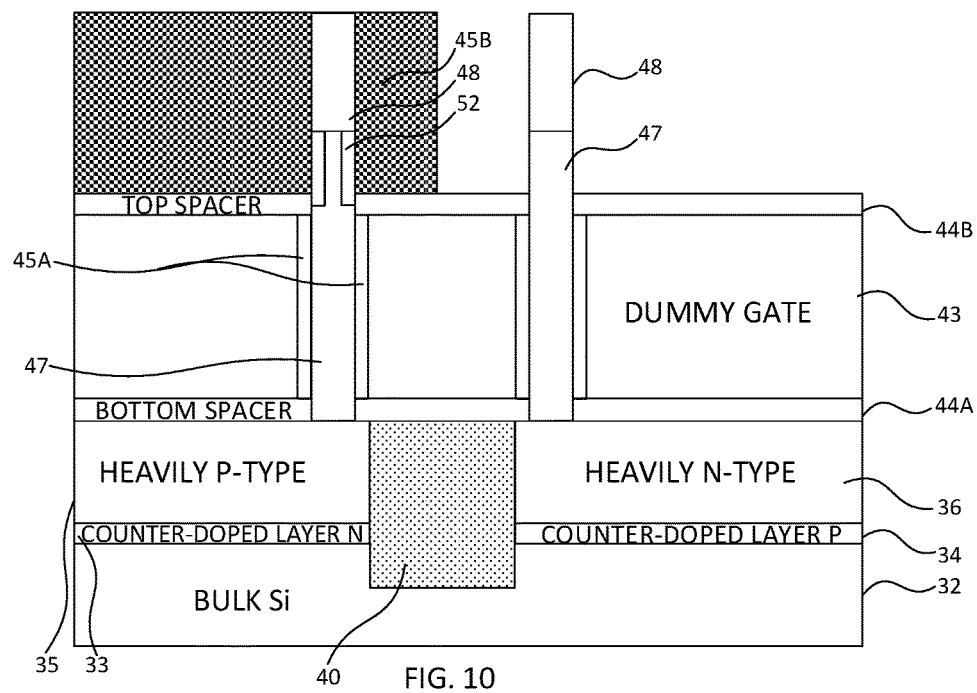
FIG. 10 is a schematic, cross-sectional view thereof following removal of the oxide layer from the nFET region and formation of an oxide layer covering the pFET region.

The nFET region above the top spacer 44B is exposed as shown in FIG. 10 following removal of the remainder of the oxide layer 45 while the pFET region is protected by a patterned oxide hard mask 45B. The top portion of the semiconductor fin 47 in the nFET region is subjected to a selective etch to reduce the width thereof. A relatively thin top fin portion 47A is accordingly provided between the top spacer 44B and the bottom of the fin cap 48 and is integral with the remainder of the fin 47. An n-doped epitaxial layer is grown on the exposed fin portion 47A and optionally subjected to ME, forming a drain region 52A of the vertical nFET to be formed in the nFET region of the structure 50. The doping levels of the in situ doped drain region 52A and the heavily doped n-type region 36 are substantially the same in some embodiments and have the same chemical compositions. In some embodiments, both the drain region 52A and the heavily doped n-type (source) region 36 consist essentially of phosphorus-doped silicon or arsenic-doped silicon. The oxide mask 45B is removed from the structure shown in FIG. 11 to again expose the pFET region above the top spacer 44B and obtain the structure shown in FIG. 12. Both drain regions 52, 52A are accordingly exposed following mask removal.

Vertical dielectric spacers 54 are formed on the drain regions 52, 52A and caps 48 extending above the horizontal top spacer 44B. In an exemplary process, a layer of a dielectric oxide, a dielectric nitride and/or a dielectric oxynitride is conformally deposited using CVD or PVD on the structure and subjected to reactive ion etching to form vertical spacers 54 having thicknesses sufficient to cover the drain regions 52, 52A. Dielectric spacer thickness may be between 15-30 nm in embodiments including faceted epitaxial drain regions (not shown). The spacer thickness can be between 10-20 nm in embodiments wherein the epitaxial portions of the drain regions have been reduced in width.

Figure 13:
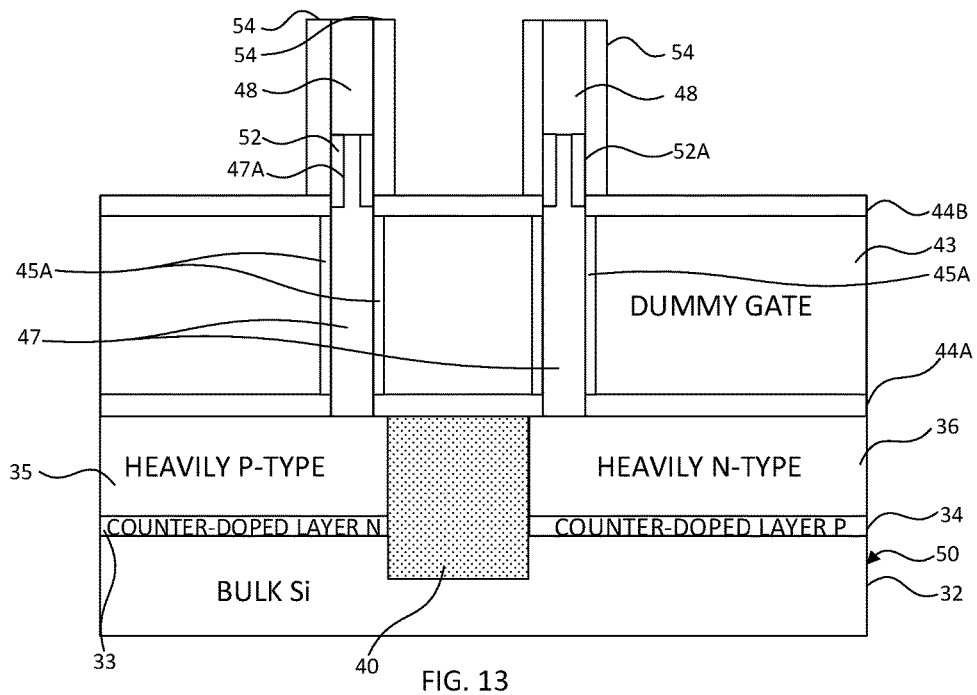
FIG. 13 is a schematic, cross-sectional view thereof following formation of spacers on the semiconductor fins.

FIG. 13 schematically illustrates a structure obtained following spacer material deposition and RIE to form the vertical spacers 54. The dielectric material(s) employed to form the vertical spacers 54 on the drain regions 52, 52A should permit selective etching with respect to the caps 48 and top horizontal spacer 44B, which remain substantially intact following formation of the vertical spacers 54.

Figure 14:
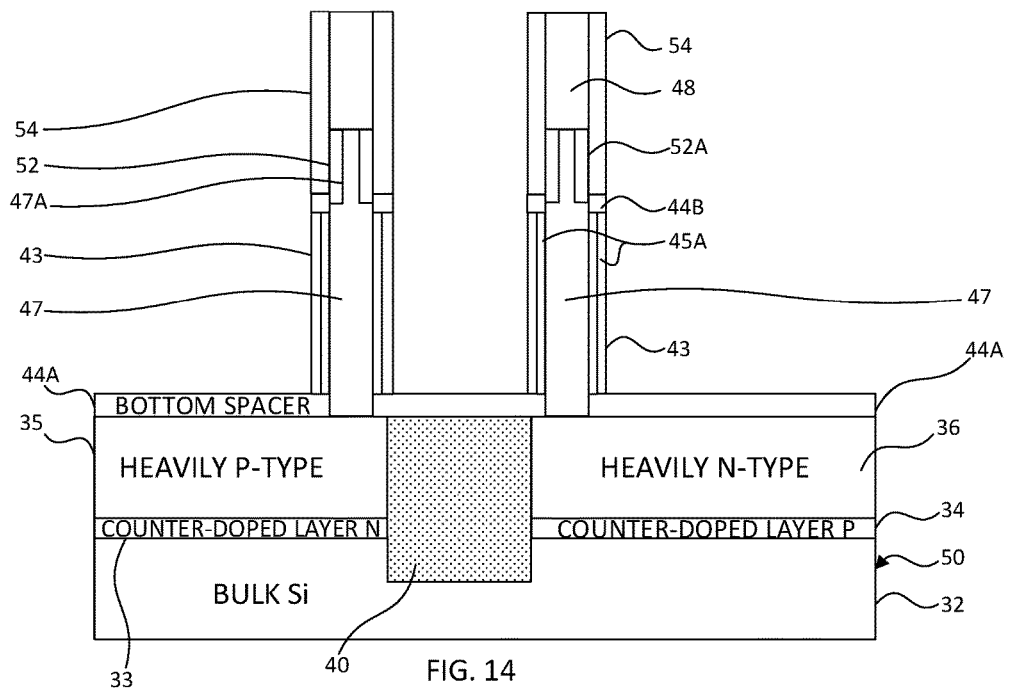
FIG. 14 is a schematic, cross-sectional view thereof following reactive ion etching to remove a portion of the dummy gate.
Figure 15:
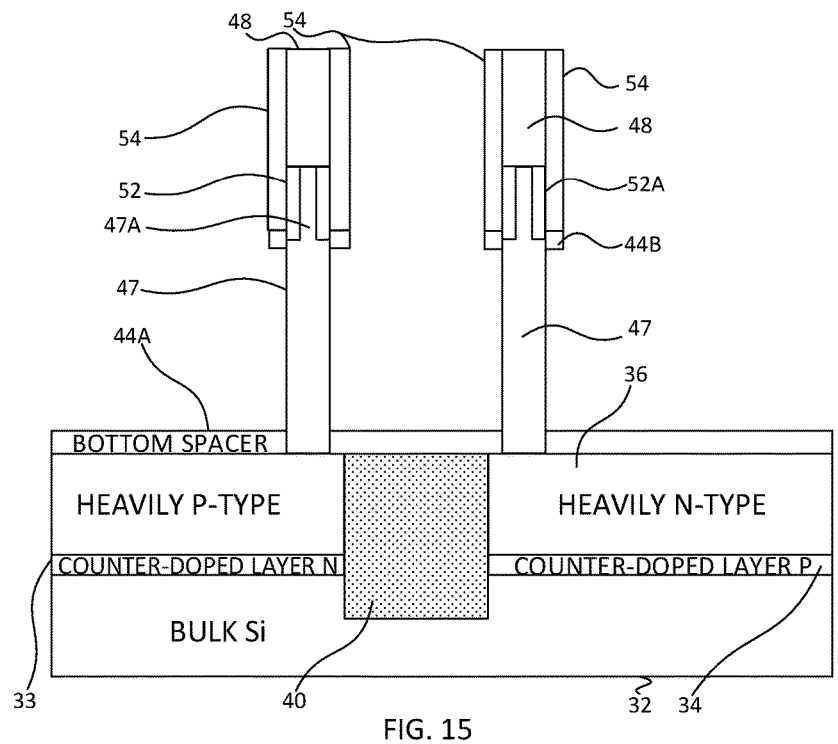
FIG. 15 is a schematic, cross-sectional view thereof following removal of the remainder of the dummy gate.

The portions of the top horizontal spacer 44B unprotected by the vertical spacers 54 and most of the dummy gate 43 are selectively removed using a dry etch such as RIE, leaving the bottom horizontal spacer 44A, the vertical spacers 54, and the portions of the horizontal top spacer 44B and dummy gate 43 protected by the vertical spacers 54 near the drain regions 52, 52A substantially intact. A two-step etch can be employed, the first step for removing portions of the top spacer 44B and the second for removing dummy gate material (for example, amorphous silicon) selective to the bottom spacer (for example, silicon nitride). The bottom spacer 44A functions as an etch stop during removal of the dummy gate material. FIG. 14 schematically illustrates the resulting structure. The dummy gate material beneath the spacers 54 is then selectively removed to provide a structure 70 as shown in FIG. 15 wherein the outer surfaces of the semiconductor fins 47 are exposed and the drain regions 52, 52A are protected by the vertical spacers 54 and the remaining portions of the top horizontal spacer 44B. A wet etch can be employed for removal of dummy gate material and the oxide layer 45A adjoining the fins 47. Hot ammonia can be employed as a wet etch in some embodiments of the process.

Figure 16:
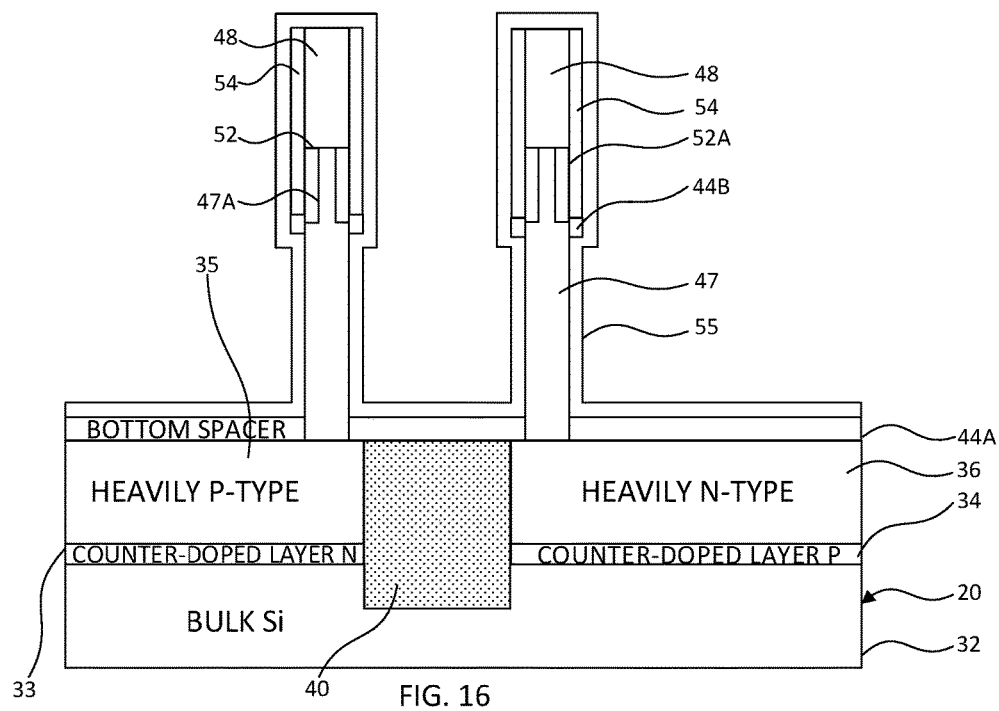
FIG. 16 is a schematic, cross-sectional view thereof following deposition of a gate dielectric layer.
Figure 17:
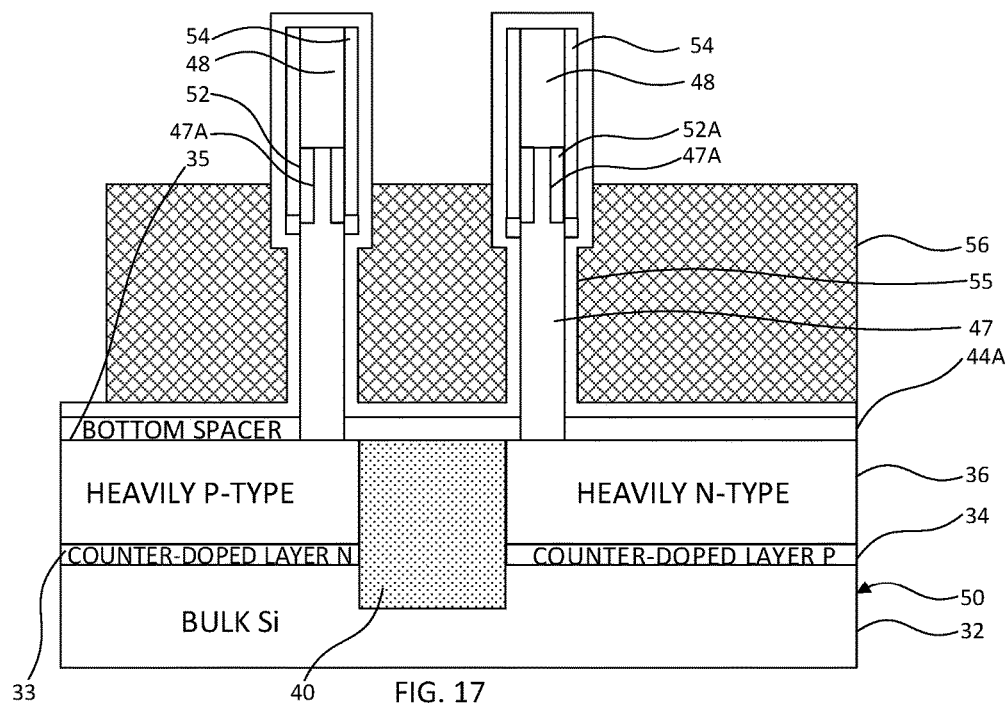
FIG. 17 is a schematic, cross-sectional view thereof following metal gate deposition, chemical mechanical planarization, and reactive ion etching.
Figure 18:
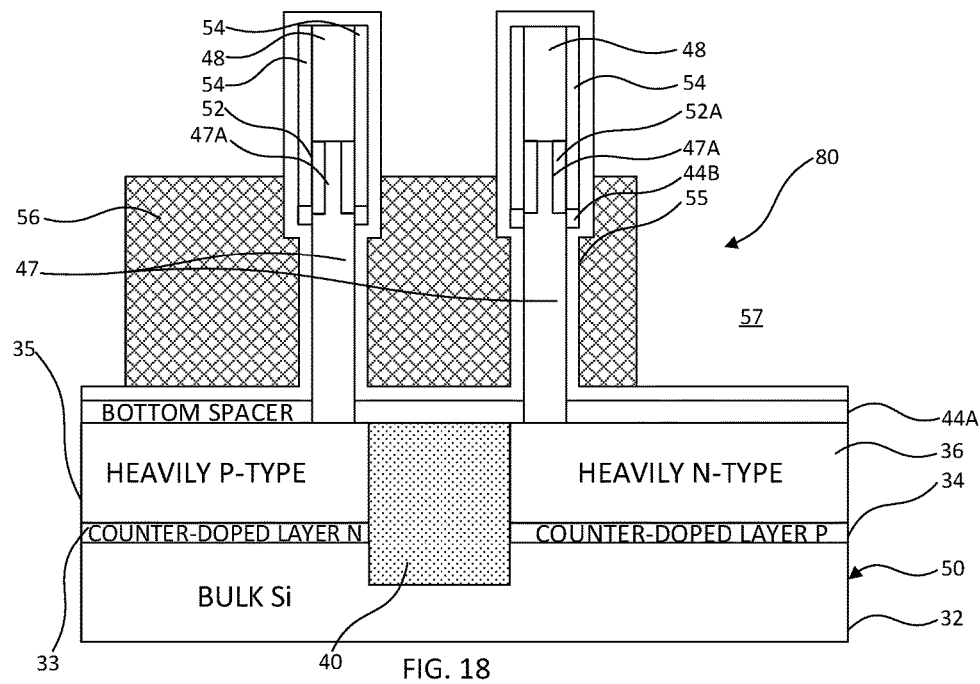
FIG. 18 is a schematic, cross-sectional view thereof following patterning of the metal gate.

As schematically illustrated in FIGS. 16-17, a gate dielectric layer 55 and a gate metal layer are formed on the structure 70. The pFET and nFET regions are processed separately, one of the regions being masked while a gate dielectric layer is formed on the exposed region. The composition and thickness of the gate dielectric layer in the pFET and nFET regions accordingly may or may not be the same. In some embodiments, a high-k gate dielectric layer is conformally deposited following completion of dummy gate removal on one region of the structure 70. The thickness of the gate dielectric material can be chosen depending on the required device performance. Chemical vapor deposition or atomic layer deposition (ALD) can be employed for depositing a high-k dielectric material such as hafnium oxide. Other exemplary high-k dielectric materials include but are not limited to $ZrO_2$, $La_2O_3$, $Al_2O_3$, $TiO_2$, $SrTiO_3$, $LaAlO_3$, $Y_2O_3$, $HFO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. The gate dielectric layer used in some devices may alternatively include a multi-layer of $SiO_2$, SiON, SiN, and a high-k dielectric material, including but not limited to hafnium oxide ($HfO_2$), aluminum oxide ($Al_2O_3$), lanthanum oxide ($La_2O_3$), zirconium oxide ($ZrO_2$), and their respective silicates. The thickness of the gate dielectric may be in the range of 1.0 nm-5.0 nm in some exemplary embodiments. Post-deposition annealing (PDA) is conducted in accordance with conventional processing procedures.

Work function metal(s) are disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering. A titanium nitride (TiN) liner/barrier film layer (not shown), for example, may be conformally deposited on the gate dielectric layer during formation of the pFET portion of the inverter using, for example, an ALD process. The barrier film layer may have a thickness of about 40 Å of titanium nitride (TiN) in embodiments wherein tungsten metallization is later employed. Tantalum nitride (Ta(N)) may alternatively be employed to form the barrier film layer. The barrier film layer may comprise multiple layers in some embodiments, including a work function material adjoining the gate dielectric layer.

Gate metal is deposited to provide a structure as schematically illustrated in FIG. 17. The gate metal and underlying barrier layer are designated by reference numeral 56 in the drawings. Optionally, hydrogen-based processes may be employed to prepare/engineer an exposed metal surface such that subsequent metal deposition takes place selectively on exposed metal surfaces as opposed to non-metal surfaces such as the surfaces of dielectric materials. Nucleation selectively takes place on an exposed electrically conductive surface during the deposition of gate metal in some embodiments. Hydrogen-based surface treatment of the structure includes exposing the structure to hydrogen under certain pressure (0.5-10 torr), temperature (200-400° C.) and flow rate (1-12 standard liters per minute (slm)). The surface material (e.g. Ti(N), Ta(N)) thereby becomes amenable to the deposition of electrically conductive metals that can function as gate electrodes.

Metal gate material is selectively or non-selectively deposited on the treated or untreated surface of the barrier layer. The gate metal layer 56 adjoins the gate dielectric layer, including the vertical portion of the gate dielectric layer that adjoins the full-width portions of the semiconductor fins 47. Chemical vapor deposition (CVD) may be employed for the selective deposition of metals such as tungsten (W). Non-limiting examples of other suitable conductive metals include aluminum (Al), platinum (Pt), gold (Au), titanium (Ti), or any combination thereof. The electrically conductive metal may be deposited by a suitable deposition process, for example, CVD, PECVD, PVD, plating, thermal or e-beam evaporation, and sputtering. The gate electrode may be deposited as multiple layers in some embodiments. Excess metal (metal overburden), if present on the structure, is removed via chemical mechanical planarization (CMP). Tungsten is amenable to reactive ion etching and allows the thickness of the gate metal to be reduced. Etch-back processes for removing tungsten and other materials are known in the art. The gate metal accordingly extends from the top surface of the horizontal portion of the gate dielectric layer 55 to the drain regions 52, 52A, partially overlapping the drain regions in some embodiments following etch-back. Both the gate metal layer 56 and associated gate dielectric layer 55 adjoin most of the full-width (channel) portions of the semiconductor fins 47, as schematically illustrated in FIG. 17, forming a device including a pair of gate-all-around (GAA) structures having good electrostatic properties and sharing a gate. The gate metal layer 56 is subsequently patterned to disconnect the device from neighboring devices that may also be formed on the bulk semiconductor substrate. In an exemplary embodiment shown in FIG. 18, gate metal is removed by RIE to form recesses 57 that extend down to the horizontal portion of the gate dielectric layer adjoining the bottom horizontal spacer 44A. The gate metal layer 56 forming the shared gate electrode of the nFET and pFET devices of the resulting exemplary structure 80 accordingly includes a first portion positioned over the p-type region 35 and a second portion extending over the n-type region. Exposed portions of the gate dielectric material and work function metal are removed using RIE or other suitable anisotropic process down to the level of the gate metal and the top surface of the n-type region 36 to obtain the structure shown in FIG. 19.

Figure 20:
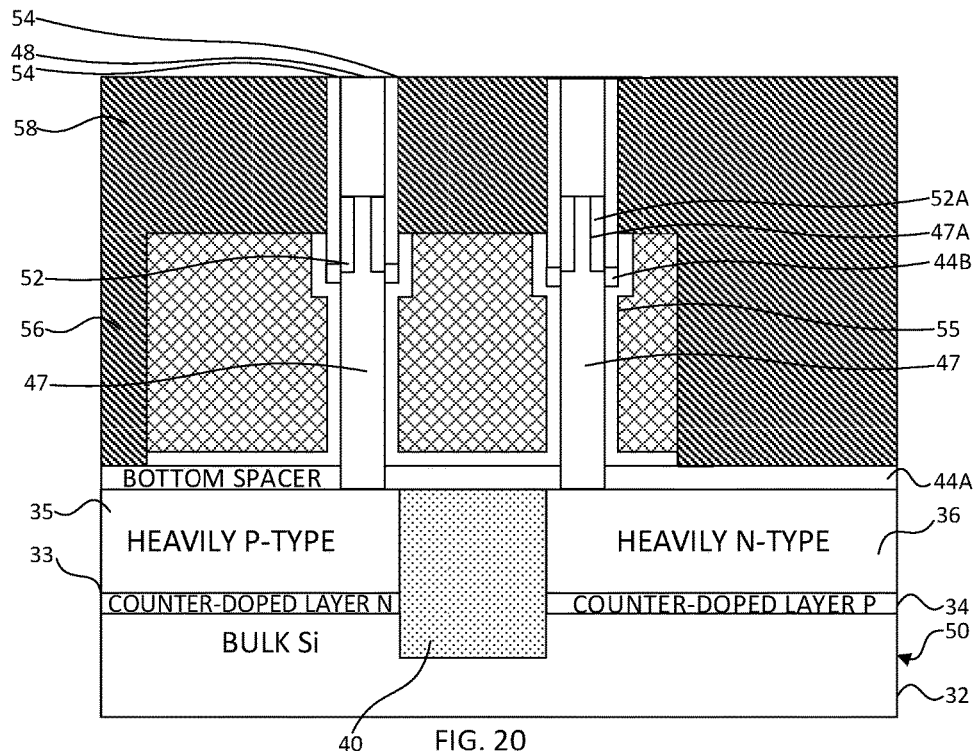
FIG. 20 is a schematic, cross-sectional view thereof following deposition of an interlayer dielectric (ILD) layer.

An interlayer dielectric (ILD) layer 58, for example silicon dioxide or a low-k dielectric such as SiOCH, can be formed on the structure using CVD or other known techniques. The ILD layer 58 may be formed from other low-k dielectric materials (with k<4.0), including but not limited to, spin-on-glass, a flowable oxide, a high density plasma oxide, borophosphosilicate glass (BPSG), or any combination thereof. The ILD layer is deposited by any suitable deposition process, including, but not limited to CVD, PVD, plasma enhanced CVD, atomic layer deposition (ALD), evaporation, chemical solution deposition, or like processes. The ILD layer 58 may be planarized using chemical mechanical planarization (CMP), as known in the art, to obtain a structure as schematically illustrated in FIG. 20. The top surfaces of the caps 48 and adjoining spacers 54 above the drain regions 52, 52A are exposed following CMP.

Figure 21:
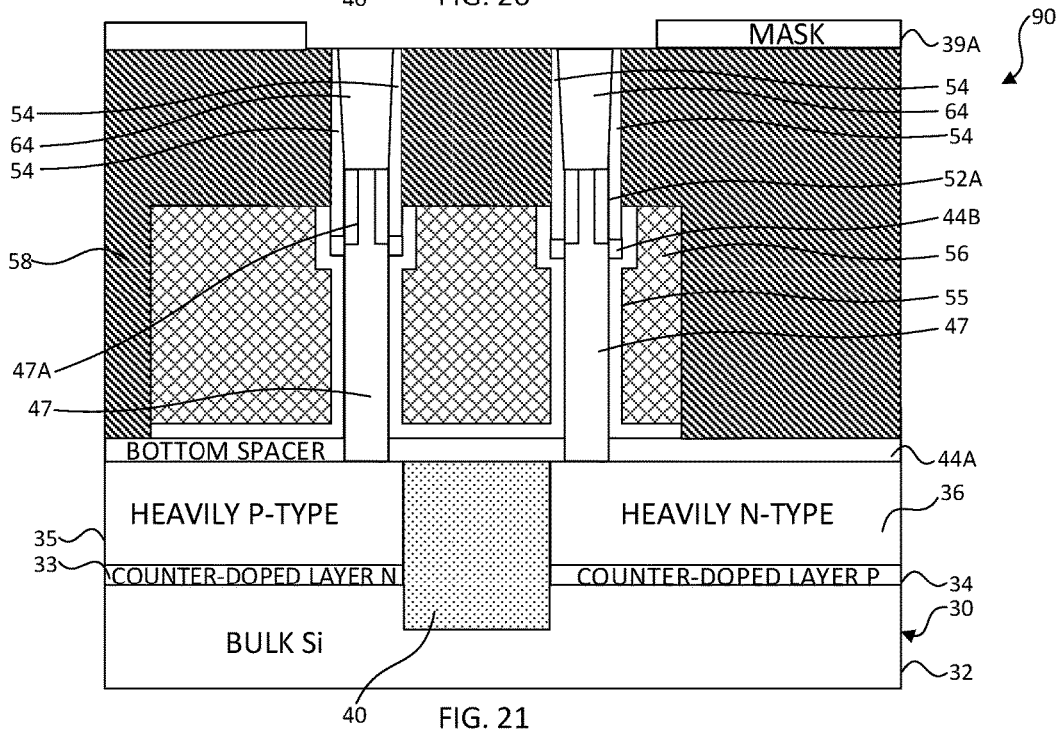
FIG. 21 is a schematic, cross-sectional view thereof following deposition and patterning of a mask on the ILD layer.
Figure 22:
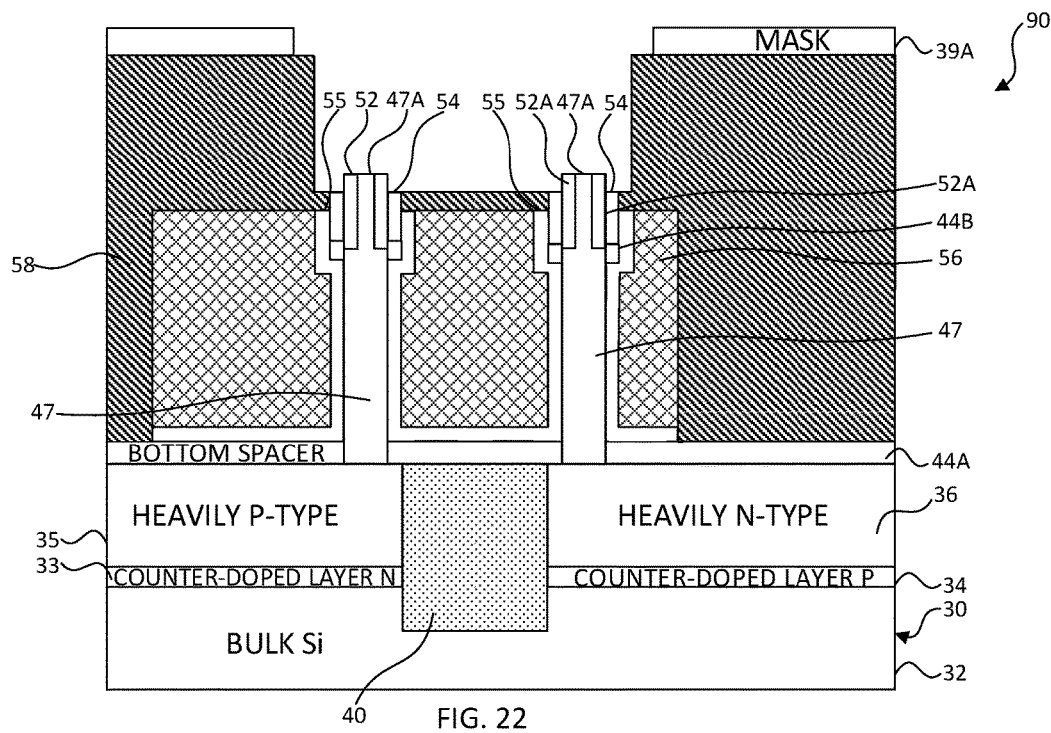
FIG. 22 is a schematic, cross-sectional view thereof following formation of a drain contact trench in the ILD layer.

A mask 39A is formed on the ILD layer 58 and patterned. As schematically illustrated in FIG. 21, the region above the drain regions 52, 52A and the STI region 40 is exposed. The ILD layer, the caps 48 and the spacers 54 are subjected to etching (for example, a reactive ion etch, a wet etch, or a combination of both) down to the drain regions 52, 52A, forming a trench within the ILD layer that contains exposed portions of both drain regions 52, 52A of the subsequently formed inverter device. As shown in FIG. 22, the portion of the ILD layer 58 surrounding the drain regions is not entirely removed by the etching process. The portion of the gate metal layer 56 between the fins 47 remains protected by the remaining portion of the ILD layer 58.

Figure 23:
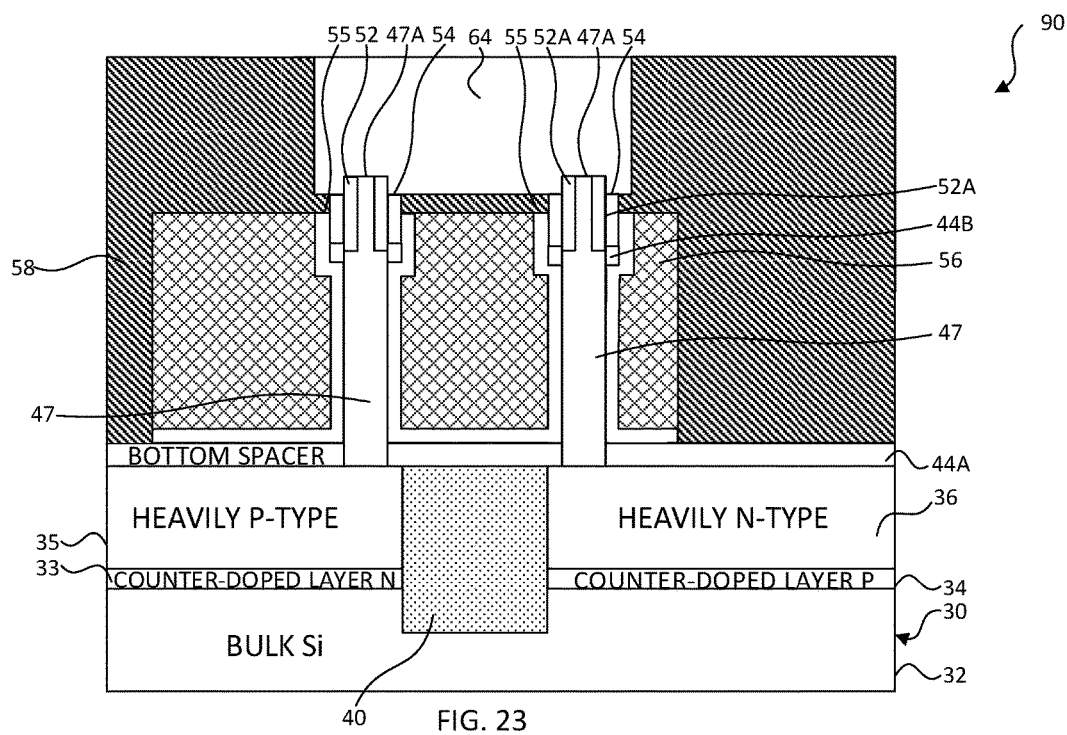
FIG. 23 is a schematic, cross-sectional view thereof following formation of a shared drain contact.

A shared contact 64 is formed within the trench containing the drain regions 52, 52A. Metal is deposited on the exposed surfaces of the drain regions and fills the trench. In one or more embodiments, a metal such as nickel, nickel platinum, or titanium is deposited. The thickness of the deposited metal layer may be between eight to ten nanometers (8-10 nm). Electroless deposition processes and atomic layer deposition (ALD) are among the techniques that may be employed. Metal deposition may be followed by low temperature silicidation to form a metal silicide layer (not shown). Annealing temperatures between 300-420° C. form uniform layers of metal-rich silicides. A contact metal layer, for example tungsten (W) or cobalt (Co), is deposited on the structure, filling the trench(es) within the ILD layer and directly contacting the metal silicide layers formed on the source/drain regions 52, 52A. The shared drain contact 64 electrically connects the drain regions 52, 52A of the pFET and nFET devices. FIG. 23 shows an exemplary inverter structure 90 following drain contact metallization.

Figure 24:
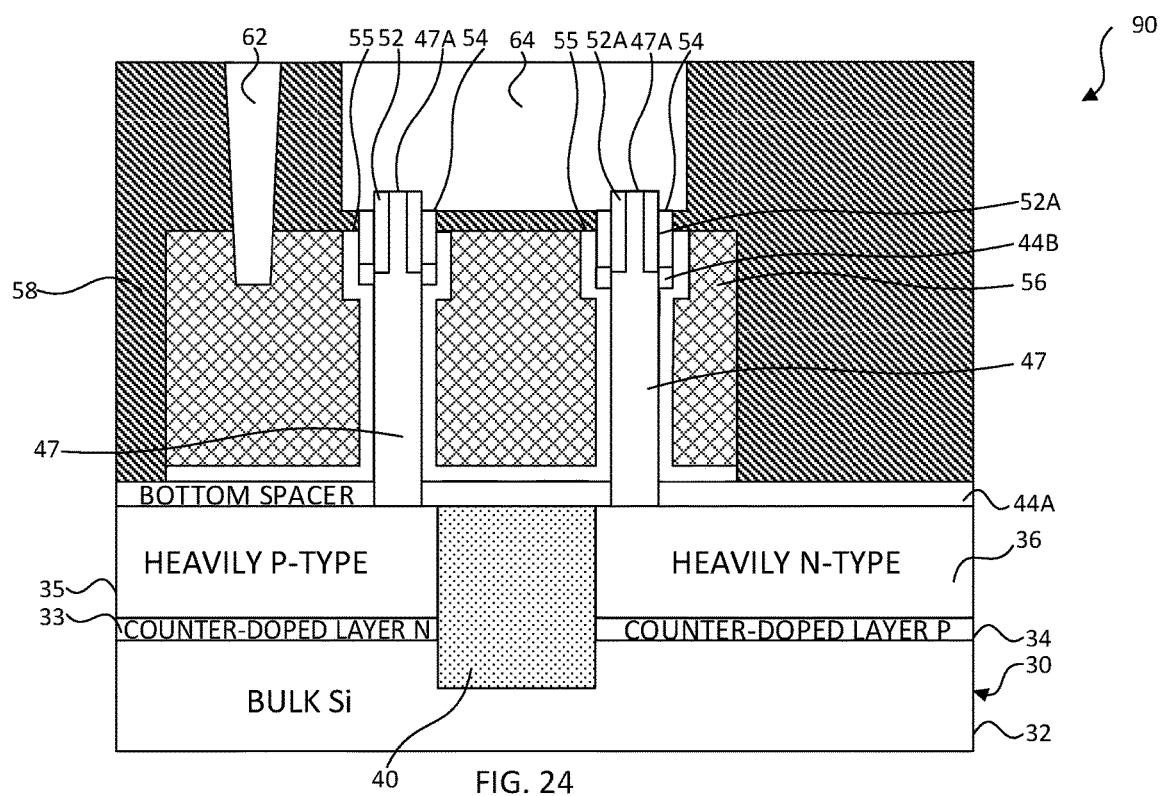
FIG. 24 is a schematic, cross-sectional view thereof following formation of a gate contact.

The gate contact(s) 62 is formed by patterning one or more additional trenches in the ILD layer. To remove ILD material and form the gate contact trenches, a resist, such as a photoresist, may be deposited on the ILD layer and patterned. An etch process, such as a ME, may be performed using the patterned resist as an etch mask to remove selected portions of the ILD until the gate metal 56 is exposed. The relatively large width of the gate metal over the p-type region 35 in the illustrated embodiment facilitates alignment of the gate contact trenches over this portion of the gate metal. The gate contact trenches are filled with a conductive material or a combination of conductive materials. The conductive material used to form the gate and/or drain contact may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any electrically conductive material from the surface of the ILD layer 58. In some embodiments, the contact metal layer is a tungsten (W) layer that is deposited using a tungsten hexafluoride source with silane. Chemical vapor deposition conducted between 300-400° C. using tungsten hexafluoride precursor chemistry may, for example, be employed to deposit a tungsten layer. Plasma enhanced CVD, thermal CVD, and atomic layer deposition are other possible options for depositing a conformal tungsten layer. The thickness of the metal contact layer should be sufficient to ensure the absence of discontinuities in the layer formed on the dielectric surfaces during a first deposition stage in embodiments where multiple deposition stages are employed. Following completion of the first stage, which in some embodiments includes multiple plasma-enhanced deposition steps, the second stage includes the thermal chemical vapor deposition (CVD) of contact metal. The PECVD process provides good nucleation while thermal CVD provides improved contact metal coverage on the trench sidewalls as compared to PECVD. Excess metal contact material (overburden) is removed by chemical mechanical planarization (CMP). As schematically illustrated in FIG. 24, the gate contact 62 is offset with respect to the transistors comprising the inverter structure. The shared gate electrode is contacted on either side of the merged drain contact and associated vertical field-effect transistors and is shown on the left side of the illustrated structure. Source contacts (not shown in FIG. 24) are formed on the heavily doped p-type and n-type regions 35, 36, which form the source regions of the vertical pFET and vertical nFET of the resulting inverter structure.

Figure 25:
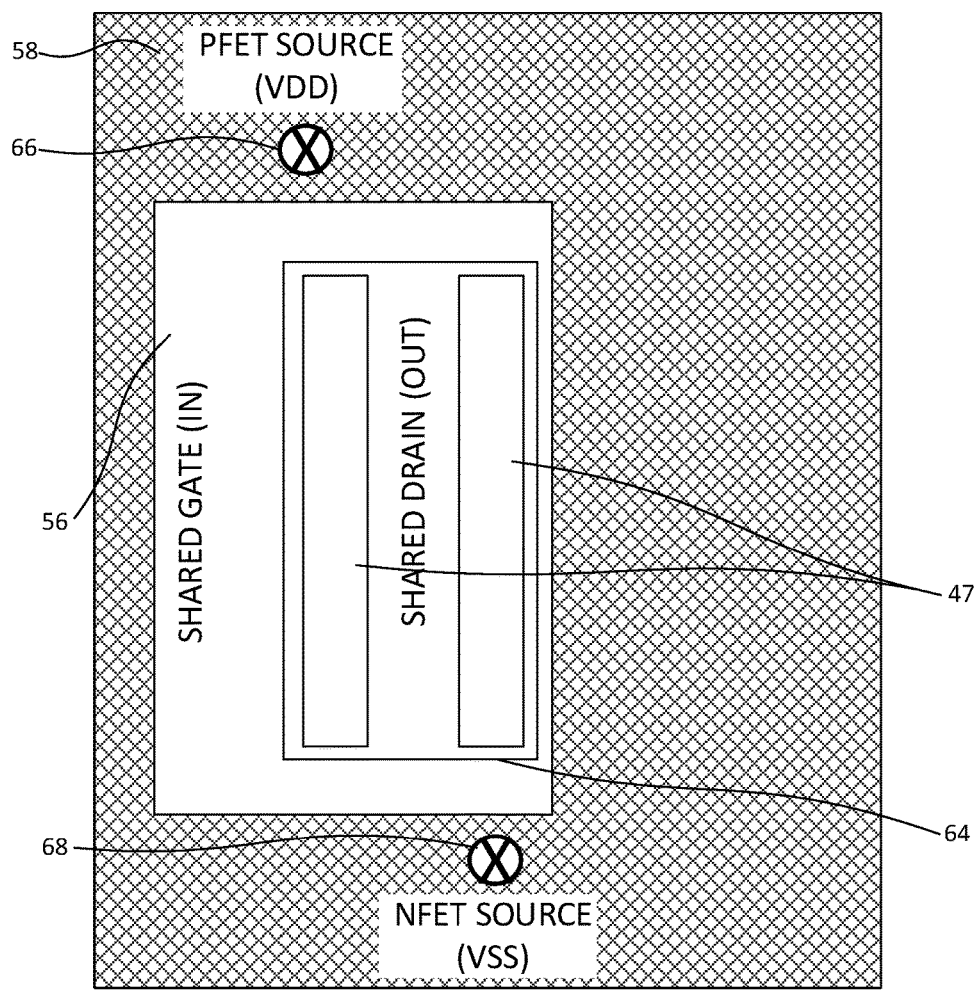
FIG. 25 is a schematic, top plan view of an inverter device provided using steps as described with respect to FIGS. 1-24.

FIG. 25 provides a schematic, top plan view of a CMOS inverter device 100 including adjacent vertical FETs configured to perform logic functions and without requiring a center gate contact. The configuration allows for close positioning of the FETs that comprise the inverter device. The shared gate metal 56 and associated row of gate contacts 62 are electrically connected to an input ($V_{in}$) while the output ($V_{out}$) includes a merged drain contact 64 operatively associated with the drains 52, 52A of the pFET and nFET devices. The merged drain contact 64 is located over the vertical field-effect transistors while the gate metal contacts 62 are offset from the field-effect transistors rather than directly over them. Supply voltage $V_{DD}$ 66 is electrically connected to the pFET source (p-type region 35) while $V_{SS}$ (e.g. ground) 68 is electrically connected to the nFET source n-type region 36).

FIGS. 1-24, as discussed above, depict exemplary processing steps/stages in the fabrication of an exemplary inverter structure. Although the overall fabrication method and the structure formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Figure 11:
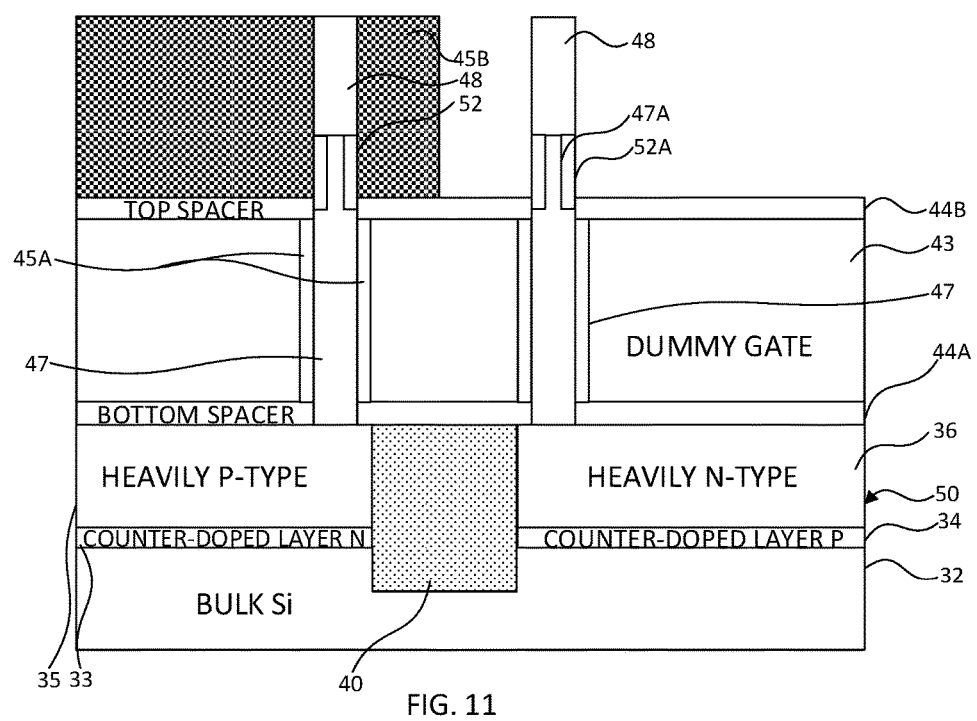
FIG. 11 is a schematic, cross-sectional view thereof following formation of recesses in a semiconductor fin in an nFET region of the structure and drain epitaxy.
Figure 12:
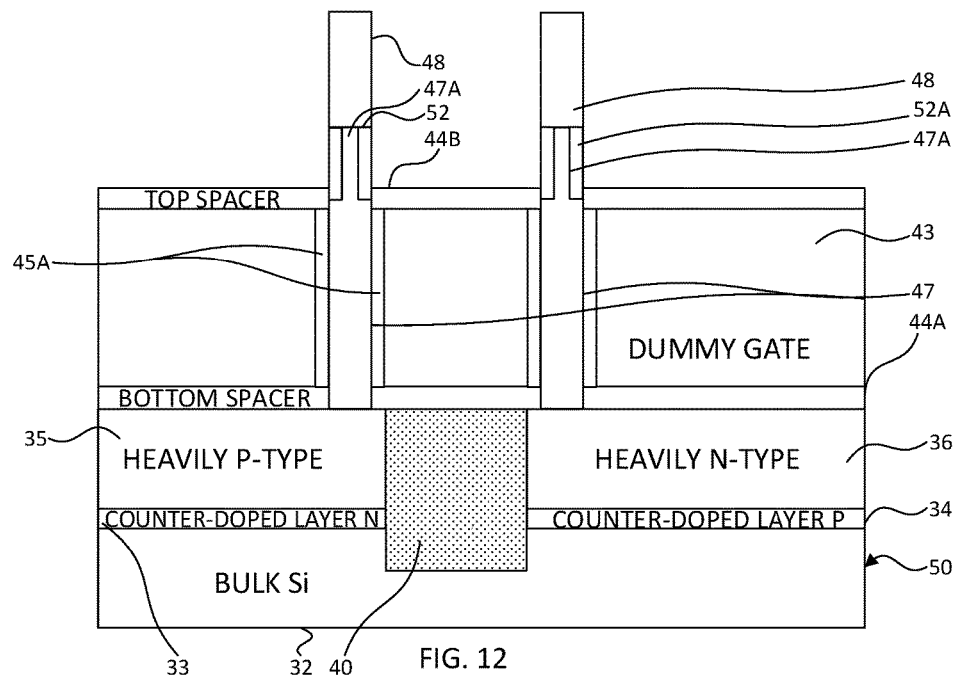
FIG. 12 is a schematic, cross-sectional view thereof following removal of the oxide layer from the pFET region.
Figure 19:
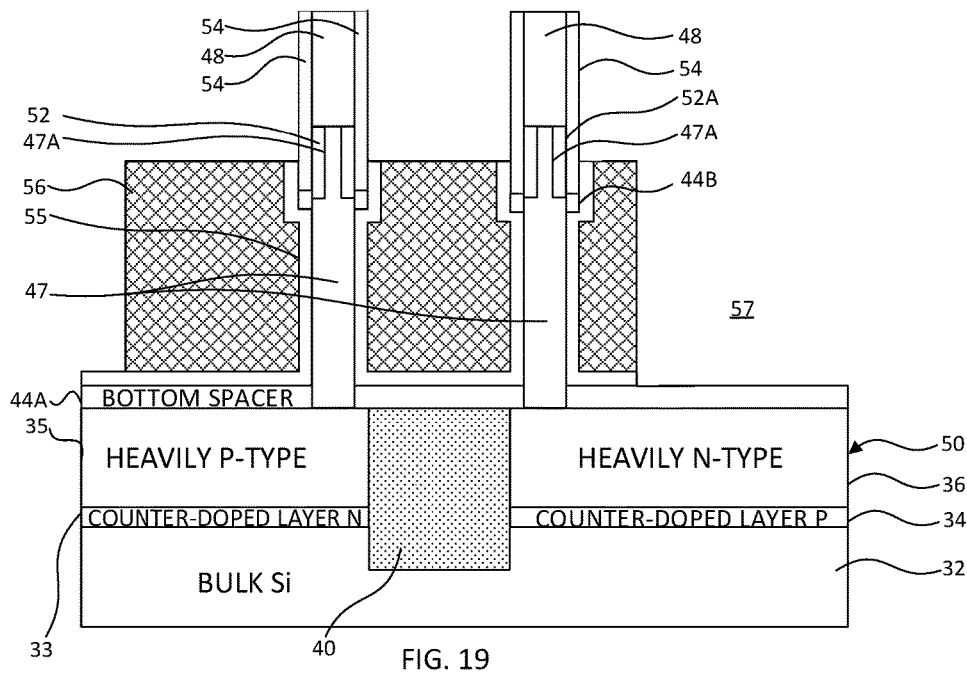
FIG. 19 is a schematic, cross-sectional view thereof following removal of the gate dielectric layer above the metal gate.

Given the discussion thus far, it will be appreciated that, in general terms, an exemplary fabrication method for forming an inverter structure includes obtaining a monolithic structure including a p-type region 35 and an n-type region 36, the p-type region being electrically isolated from the n-type region. An exemplary monolithic structure 50 is shown in FIG. 6. A dummy gate 43 is formed on the monolithic structure, as schematically illustrated in FIG. 7. With reference to FIG. 8, first and second semiconductor fins 47 are epitaxially formed on the monolithic structure 50 and within the dummy gate 43, the first semiconductor fin being formed on the p-type region 35 and the second semiconductor fin being formed on the n-type region 36. A first drain region 52 having p-type conductivity is formed on the first semiconductor fin and above the dummy gate and a second drain region 52A having n-type conductivity is formed on the second semiconductor fin, also above the dummy gate 43. FIG. 11 shows and exemplary structure obtained following formation of the drain regions. The dummy gate is replaced by a gate dielectric layer 55 and an electrically conductive gate electrode 56 on the gate dielectric layer such that the gate dielectric layer adjoins the first and second semiconductor fins 47 and the gate electrode adjoins the gate dielectric layer. The gate dielectric material adjoining the first fin may or may not be the same as the gate dielectric material adjoining the second fin. One of the fins 47 can be masked while gate dielectric material is deposited on the other fin 47. FIG. 17 shows an exemplary structure including an electrically conductive gate electrode 56 that is shared by the pFET and nFET structures thereon. The p-type region, the first semiconductor fin, the first drain region, and the gate electrode are configured as a vertical, p-type field-effect transistor wherein the p-type region is functional as a source region of the transistor and the semiconductor fin 47 includes a channel region. Similarly, the n-type region, the second semiconductor fin, the second drain region, and the gate electrode are configured as a vertical, n-type field-effect transistor within the inverter structure. The fabrication method may further include electrically connecting the gate electrode 56 to an input line and electrically connecting the first and second drain regions 52, 52A to an output line. The n-type (source) region of the n-type field-effect transistor can be electrically connected to a relatively low voltage power supply ($V_{SS}$) 68 such as ground while the p-type (source) region of the p-type field-effect transistor can be electrically connected to a relatively high voltage power supply ($V_{DD}$) 66, as shown in FIG. 22. In some embodiments, the fabrication method further includes forming a bottom spacer 44A on the monolithic structure, forming a top spacer 44B on the dummy gate 43, and forming a top dielectric layer 45 on the top spacer. FIG. 7 shows an exemplary structure including such elements. As shown in FIG. 8, the first and second semiconductor fins are formed within the top dielectric layer 45 and through openings within the dummy gate 43 and the bottom and top spacers 44A, 44B. The top portions of the fins 47 accordingly extend above the top spacer 44B while the main body portions of the fins that later function as channel regions are located between the bottom and top spacers. In some embodiments, the fabrication method includes reducing the widths of the top portions of the semiconductor fins and epitaxially forming the drain regions on the fin top portions following width reduction. The gate metal may be recessed over one of the p-type or n-type regions, such as shown in FIG. 19. A gate contact 62 is formed on a relatively wide portion of the gate electrode formed by the gate metal, which is the portion extending over the p-type (source) region 35 of the structure 90 shown in FIG. 21. A shared drain contact 64 formed directly above the vertical transistors and the STI region 40 facilitates electrical connection of the inverter drain regions to an output line.

A monolithic inverter structure is further provided that includes a semiconductor structure including a p-type source region 35 and an n-type source region 36, the p-type source region being electrically isolated from the n-type source region. A first semiconductor fin 47 directly contacts the p-type region and a second semiconductor fin 47 directly contacts the n-type region. A first drain region on the first semiconductor fin has p-type conductivity while a second drain region on the second semiconductor fin has n-type conductivity. The portions of the semiconductor fins between the source and drain regions are operable as channel regions. A gate dielectric layer 55 adjoins the first and second semiconductor fins and a gate electrode 56 adjoins the gate dielectric layer. The p-type source region, the first semiconductor fin, the first drain region, and the gate electrode are configured as a vertical, p-type field-effect transistor. The n-type source region, the second semiconductor fin, the second drain region, and the gate electrode are configured as a vertical, n-type field-effect transistor, the gate electrode being shared by the p-type field-effect transistor and the n-type field-effect transistor. The drain regions 52, 52A of the inverter structure are electrically connected. As shown in FIG. 24, a gate contact 62 extends through an interlayer dielectric layer and electrically contacts the gate electrode. A shared drain contact 64 is positioned directly above the p-type field-effect transistor and the n-type field-effect transistor. The shared drain contact 64 extends through the interlayer dielectric layer and electrically contacts both drain regions of the inverter device. The gate contact is laterally offset with respect to the drain contact and underlying fins 47 of the vertical transistors.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having inverters and contacts formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A fabrication method for forming an inverter structure, comprising:

obtaining a monolithic structure including a p-type region and an n-type region, the p-type region being electrically isolated from the n-type region;

forming a dummy gate on the monolithic structure;

epitaxially forming first and second semiconductor fins on the monolithic structure and within the dummy gate, the first semiconductor fin being formed on the p-type region and the second semiconductor fin being formed on the n-type region;

forming a first drain region on the first semiconductor fin and above the dummy gate, the first drain region having p-type conductivity;

forming a second drain region on the second semiconductor fin and above the dummy gate, the second drain region having n-type conductivity, and replacing the dummy gate with a gate dielectric layer and an electrically conductive gate electrode on the gate dielectric layer such that the gate dielectric layer adjoins the first and second semiconductor fins and the gate electrode adjoins the gate dielectric layer, and further such that:

the p-type region, the first semiconductor fin, the first drain region, and the gate electrode form a vertical, p-type field-effect transistor, the n-type region, the second semiconductor fin, the second drain region, and the gate electrode form a vertical, n-type field-effect transistor, and the gate electrode is shared by the p-type field-effect transistor and the n-type field-effect transistor.

2. The method of claim 1, further including:

forming an interlayer dielectric layer over the gate electrode;

forming a first trench in the interlayer dielectric layer exposing portions of the first drain region and the second drain region;

forming a drain contact within the first trench, the drain contact being shared by the first and second drain regions;

forming a second trench in the interlayer dielectric layer down to the gate electrode, and forming a gate contact within the second trench, the gate contact being electrically connected to the gate electrode.

3. The method of claim 2, further including:
electrically connecting the gate contact to an input line;
electrically connecting the drain contact to an output line;
electrically connecting the n-type region of the n-type field-effect transistor to a relatively low voltage power supply, and
electrically connecting the p-type region of the p-type field-effect transistor to a relatively high voltage power supply.

4. The method of claim 2, wherein the monolithic structure further includes first and second electrically isolated, counter-doped regions adjoining the p-type region and the n-type region, respectively, further including:
forming a bottom spacer on the monolithic structure;
forming a top spacer on the dummy gate;
forming a top dielectric layer on the top spacer;
forming first and second vertical recesses extending through the top dielectric layer, the top spacer, the dummy gate, and the bottom spacer, and
further wherein epitaxially forming the first and second semiconductor fins includes forming the semiconductor fins respectively within the first and second vertical recesses.

5. The method of claim 4, further including:
exposing a top portion of the first semiconductor fin above the top spacer;
forming the first drain region on the exposed top portion of the first semiconductor fin;
exposing a top portion of the second semiconductor fin above the top spacer;
forming the second drain region on the exposed top portion of the second semiconductor fin, and
forming the drain contact directly above the first drain region and the second drain region.

6. The method of claim 5, further including:
reducing the width of the top portion of the first semiconductor fin;
epitaxially growing a p-type drain region to form the first drain region;
reducing the width of the top portion of the second semiconductor fin;
epitaxially growing an n-type drain region to form the second drain region, and
reducing the widths of the first and second drain regions.

7. The method of claim 6, further including:
electrically connecting the gate contact to an input line;
electrically connecting the drain contact to an output line;
electrically connecting the n-type region of the n-type field-effect transistor to a relatively low voltage power supply, and
electrically connecting the p-type region of the p-type field-effect transistor to a relatively high voltage power supply.

8. The method of claim 7, wherein the low voltage power supply is ground.

9. The method of claim 2, further including:
recessing the gate electrode to form a first gate electrode portion extending laterally over the p-type region and a second gate electrode portion extending laterally over the n-type region, one of the first and second gate electrode portions having a larger width than the other of the first and second gate electrode portions, wherein the second trench is formed directly above the wider of the first and second gate electrode portions.

10. The method of claim 1, wherein obtaining the monolithic structure includes:
obtaining a first structure including a substrate layer, the p-type region, the n-type region, a first counter-doped region between the substrate layer and the p-type region, and a second counter-doped region between the substrate layer and the n-type region;
forming a first dummy fin on the p-type region and a second dummy fin parallel to the first dummy fin on the n-type region;
forming a dielectric layer on the first structure;
forming a mask layer on the dielectric layer and extending over the p-type region, the n-type region, and the first and second dummy fins;
patterning the mask layer;
recessing the dielectric layer selective to the dummy fins and the p-type and n-type regions to form a recess extending between the dummy fins and down to the p-type and n-type regions;
forming a trench extending from the recess and through adjoining portions of the p-type region and the n-type region, through adjoining portions of the first and second counter-doped regions, and into the substrate layer;
removing the mask layer;
filling the trench with a dielectric material to form an isolation region, and
removing the dummy fins and the dielectric layer.

11. The method of claim 10, wherein each of the dummy fins has a width of at least ten nanometers and not more than twenty-five nanometers.

* * * * *